United States Patent
Blanken et al.

(10) Patent No.: US 6,369,730 B1
(45) Date of Patent: Apr. 9, 2002

(54) SIGMA-DELTA ANALOG-TO-DIGITAL CONVERTER

(75) Inventors: Pieter G. Blanken; Eric J. Van der Zwan; Eise C. Dijkmans, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/553,602

(22) Filed: Apr. 20, 2000

(30) Foreign Application Priority Data

Apr. 21, 1999 (EP) ............................................ 99201263

(51) Int. Cl.[7] ................................................ H03M 3/00
(52) U.S. Cl. ........................................ 341/143; 341/155
(58) Field of Search ................................... 341/143, 155

(56) References Cited

U.S. PATENT DOCUMENTS

| | | | | |
|---|---|---|---|---|
| 3,609,551 A | * | 9/1971 | Brown ......................... | 341/143 |
| 4,588,981 A | * | 5/1986 | Senn ........................... | 341/143 |
| 4,754,131 A | * | 6/1988 | Ribner et al. ................ | 341/143 |
| 5,079,550 A | * | 1/1992 | Sooch et al. ................. | 341/143 |
| 5,103,228 A | * | 4/1992 | Voorman et al. ............. | 341/143 |
| 5,311,181 A | * | 5/1994 | Ferguson et al. ............ | 341/143 |
| 5,347,279 A | * | 9/1994 | Ishihara et al. .............. | 341/143 |
| 5,392,042 A | * | 2/1995 | Pellon .......................... | 341/143 |
| 5,959,562 A | * | 9/1999 | Wiesbauer ................... | 341/143 |
| 6,087,969 A | * | 7/2000 | Stockstad et al. ........... | 341/143 |

FOREIGN PATENT DOCUMENTS

| | | |
|---|---|---|
| EP | 0495328 A1 | 7/1992 |
| GB | 2150676 A | 7/1985 |

* cited by examiner

Primary Examiner—Peguy Jeanpierre
Assistant Examiner—Jean Bruner Jeanglaude
(74) Attorney, Agent, or Firm—Aaron Walker

(57) ABSTRACT

Sigma-delta analog-to-digital converter topology with an error signal branch including a subtractor (10), a loop filter (4), and a quantizer (6), and a feedback branch including a digital-to-analog converter (8). The gain error caused by a return-to-zero switch in the feedback branch is cancelled by moving the return-to-zero switch (20) to the signal error branch.

2 Claims, 4 Drawing Sheets

SIGMA-DELTA ANALOG-TO-DIGITAL CONVERTER

BACKGROUND OF THE INVENTION

The invention relates to a sigma-delta analog-to-digital converter for converting an analog input signal into a digital output signal, comprising in a signal processing loop:

means for providing a difference signal in response to the analog input signal and an analog feedback signal;

means for filtering the difference signal and for providing a filtered difference signal;

means for sampling and quantizing the filtered difference signal and having an output for providing the digital output signal;

a digital-to-analog converter for converting the digital output signal to the analog feedback signal; and a return-to-zero switch included in the signal processing loop.

Such a sigma-delta analog-to-digital converter is known, for example, from European Patent Application No. 0 495 328. This known sigma-delta analog-to-digital converter has a return-to-zero switch in its feedback branch to reduce the non-linearity caused by the digital-to-analog converter in the feedback branch. The rising and falling edges of the output signal generated by the digital-to-analog converter have non-zero rise and fall times. In the case that the input code of the digital-to-analog converter does not change, the output signal of the digital-to-analog converter remains constant during the clock period. In the case that the input code does change, the output signal of the digital-to-analog converter changes from one level to another level. Due to the non-zero rise or fall times the net signal content in that clock period is different from that in a clock period with no input code change. The net signal content per clock period thus depends on the code, which is a non-linear effect causing inter-symbol interference and thus distortion. The return-to-zero switch in the feedback branch reduces this effect by excluding the output signal portions of the digital-to-analog converter during the transitions from the one level to the other level. However, this return-to-zero switching also changes the frequency spectrum of the analog feedback signal, which results in a low frequency gain change and thus a gain error.

SUMMARY OF THE INVENTION

It is an object of the invention to provide a sigma-delta analog-to-digital converter with an improved gain accuracy. To this end, the sigma-delta analog-to-digital converter as defined in the opening paragraph is characterized in that the return-to-zero switch is arranged between an output of the means for providing the difference signal and an input of the means for filtering the difference signal.

By arranging the return-to-zero switch before the means for filtering the open-loop gain is reduced by the return-to-zero action, but the closed-loop gain is hardly affected, as long as the remaining open-loop gain is sufficiently large, which is the case in practice. In this way the gain accuracy is restored.

In a preferred embodiment the analog input signal and the analog feedback signal are converted to currents by means of voltage-to-current converters. In this way the difference signal is obtained by a simply interconnecting of the outputs of the voltage-to-current converters. The digital-to-analog converter may have differential outputs and the voltage-to-current converters may have differential inputs and outputs to improve the performance of the sigma-delta analog-to-digital converter.

BRIEF DESCRIPTION OF THE DRAWING

These and other aspects, features and advantages of the invention will be apparent from the following description of exemplary embodiments of the invention with reference to the accompanying drawings, in which.

Like reference symbols are employed in the drawings and in the description of the embodiments to represent the same or similar items.

DESCRIPTION OF THE PREFERRED EMBODIMENTS

Figure 1A:
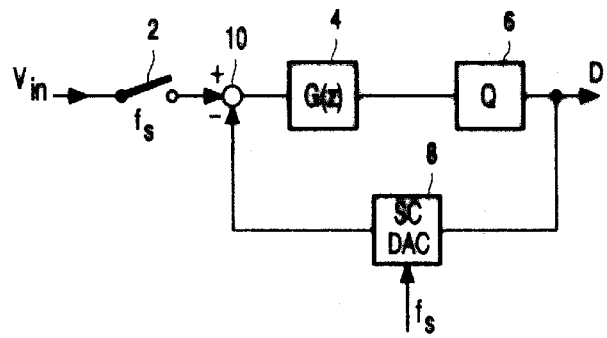
FIG. 1A is a circuit diagram of a conventional discrete-time sigma-delta analog-to-digital converter with a switched-capacitor digital-to-analog converter in the feedback loop.

Sigma-delta analog-to-digital converters can roughly be divided in two classes. The first class, shown in FIG. 1A, has a sampler 2 at the input, and is usually a switched-capacitor circuit. Its modulator works in the discrete-time domain with a discrete-time loop filter 4 which feeds a quantizer 6. The data output signal D of the quantizer 6 is fed back via a switched-capacitor digital-to-analog converter (DAC) 8 and subtracted from the sampled analog input signal $V_{in}$ in a subtractor 10. The quantizer 6 and the digital-to-analog converter 8 may have 1-bit or multi-bit resolution.

Figure 1B:
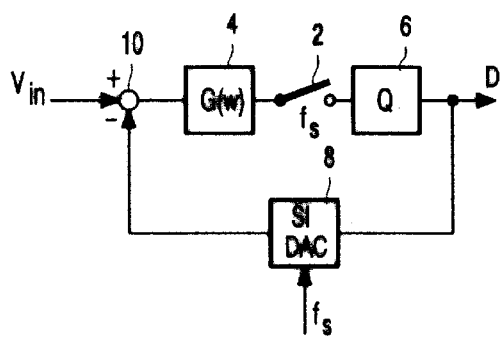
FIG. 1B is a circuit diagram of a conventional sigma-delta analog-to-digital converter with a continuous-time loop filter and a switched-current digital-to-analog converter in the feedback loop.

The second class, shown in FIG. 1B, has a continuous-time loop filter 4 and a switched-current digital-to-analog converter 8 in the feedback loop. The sampler 2 has been moved to the output of the continuous-time loop filter 4. In a switched-current digital-to-analog converter the output current is more or less constant during the clock period. In a switched-capacitor digital-to-analog converter the output current is not constant during the clock period. It usually is high at the beginning of the clock period and negligibly low at the end of the clock period. The total charge delivered during the clock period may be equal to that of a switched-current digital-to-analog converter. In this second class the quantizer 6 and the digital-to-analog converter 8 may also have 1-bit or multi-bit resolution.

Figure 2:
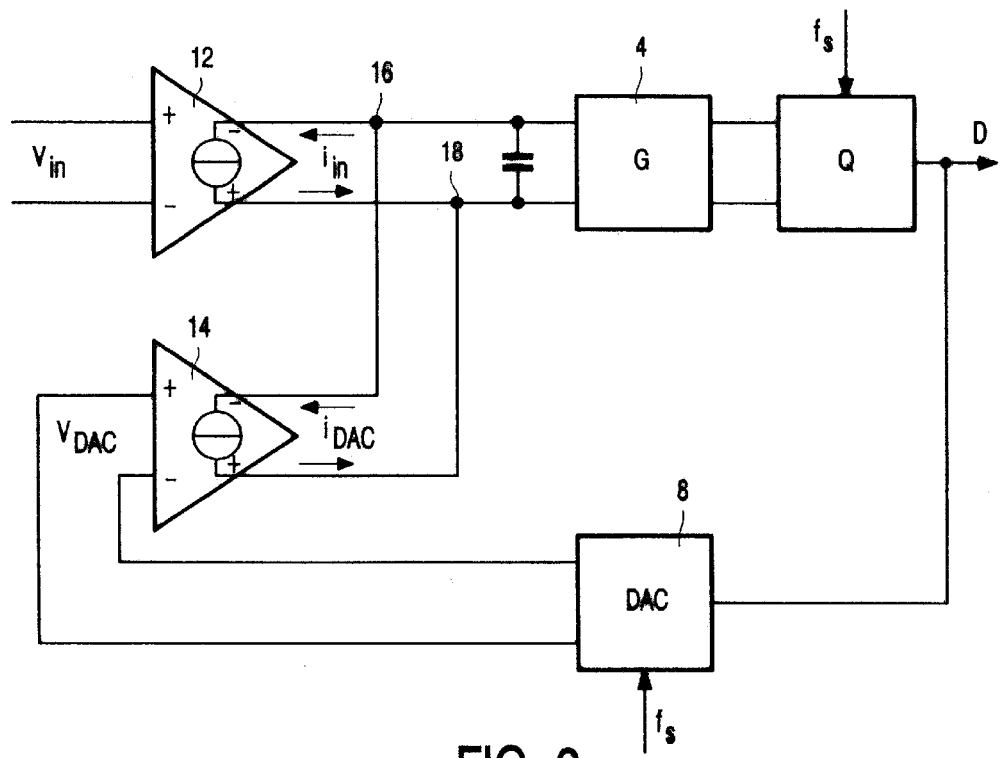
FIG. 2 is a circuit diagram of an implementation of the sigma-delta analog-to-digital converter of FIG. 1B using differential input/output transconductors.

A sigma-delta analog-to-digital converter from the second class of FIG. 1B may be implemented using differential input and output transconductors as shown in FIG. 2. The analog input voltage $V_{in}$ is converted into a differential current $i_{in}$ by means of a first voltage-to-current converter 12 and the output signal $V_{DAC}$ from the digital-to-analog converter 8 is converted into a differential current $i_{DAC}$ by means of a second voltage-to-current converter 14. The output currents are added in nodes 16 and 18 and fed to the continuous-time loop filter 4. The digital-to-analog converter 8 is, by way of example, a 1-bit converter which supplies an output voltage $V_{DAC}=c\cdot V_{ref}$, in which c is the output code (+1 or −1) of the data signal D and $V_{ref}$ is a reference voltage, usually a voltage proportional to a bandgap reference voltage. In a multi-bit system the output code c can take more than two values. For example, in a 3-bit system the output code c is one of the values −1, −5/7, −3/7, −1/7, +1/7, +3/7, +5/7, +1. The differential output current $i_{DAC}$ is equal to $g_m\cdot V_{DAC}=g_m\cdot c\cdot V_{ref}$, in which $g_m$ is the transconductance of the second voltage-to-current converter 14. The clock period $T=1/f_s$, in which $f_s$ is the sampling frequency. The net charge q thus flowing per clock period is: $q=I\cdot T=c\cdot g_m\cdot V_{ref}\cdot T$, in which I is the value of the output current $I_{DAC}$.

Figure 3:
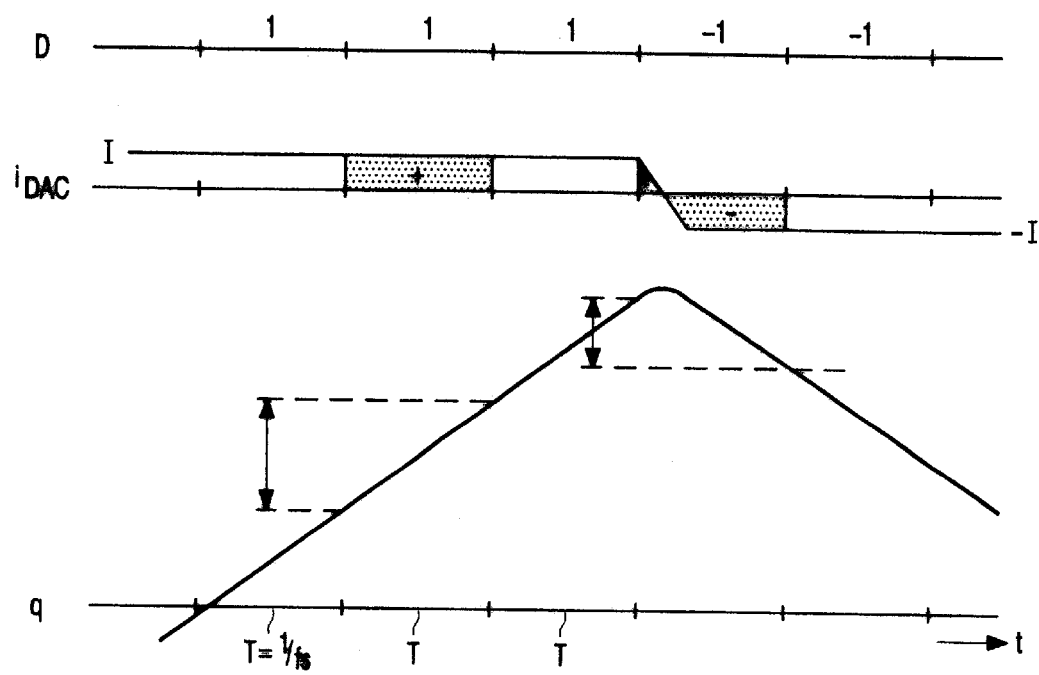
FIG. 3 shows signals illustrating the operation of the sigma-delta analog-to-digital converter of FIG. 2.

The problem to addressed is the non-linearity of the feedback digital-to-analog converter 8. The rising and falling edges have non-zero rise and fall times. When the input code D does not change, the differential output current $i_{DAC}$ remains constant, as shown in FIG. 3. After one clock period a net charge q equal to $g_m\cdot V_{ref}\cdot T$ has flown through the nodes 16 and 18, either in a positive or in a negative direction. When the input code D does change, for example from +1 to −1, the differential output current $i_{DAC}$ switches from $g_m\cdot V_{ref}$ to $-g_m\cdot V_{ref}$. Due to the non-zero rise time or fall time the net charge transported in one clock period differs from $g_m\cdot V_{ref}\cdot T$. The net charge per clock period thus depends on the code, which is a non-linear effect causing inter-symbol interference (ISI) and thus distortion.

Figure 4:
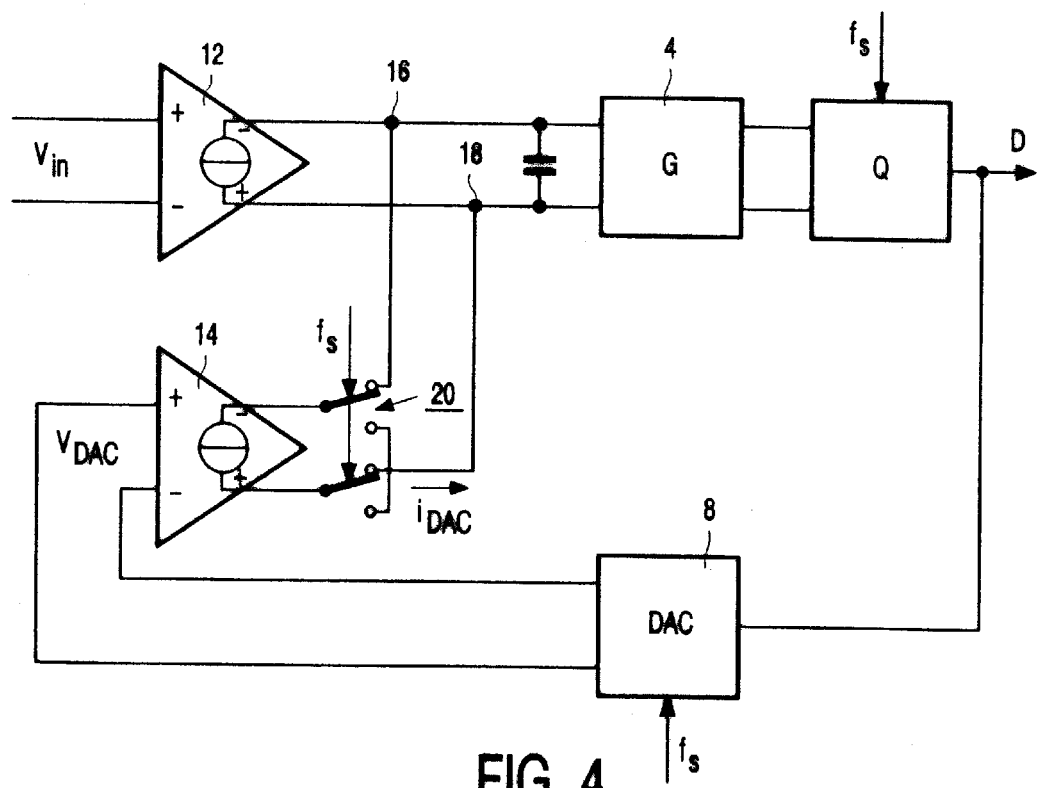
FIG. 4 is a circuit diagram of the sigma-delta analog-to-digital converter of FIG. 3 with a return-to-zero switch in the feedback branch.
Figure 5:
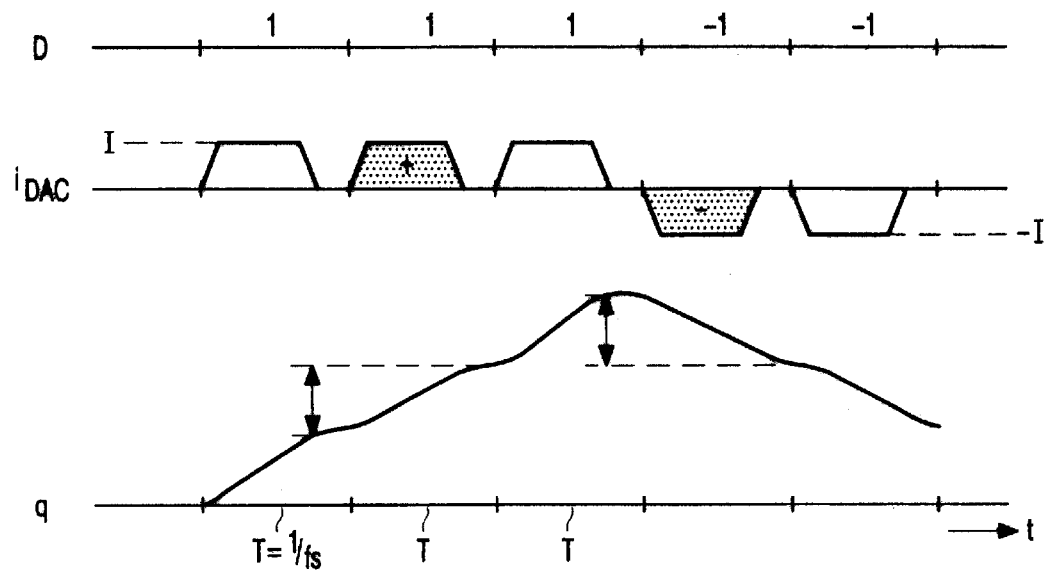
FIG. 5 shows signals illustrating the operation of the sigma-delta analog-to-digital converter of FIG. 4.

A known solution to circumvent this non-linear effect is to implement a return-to-zero scheme, as shown in FIG. 4. A return-to-zero switch 20 switches the output current $i_{DAC}$ of the second voltage-to-current converter 14 to zero for part of the clock period T, as shown in FIG. 5. This return-to-zero switching in the feedback branch takes place synchronously with the sampling frequency. As a result, the frequency spectrum of the feedback current $i_{DAC}$ changes, especially for high frequencies, but the low-frequency content of the spectrum only corresponds to a gain change. No new low frequencies are introduced, so aliasing is no problem. The scheme thus avoids ISI at the cost of a change in low-frequency gain. Thus a gain accuracy problem is introduced.

Figure 6:
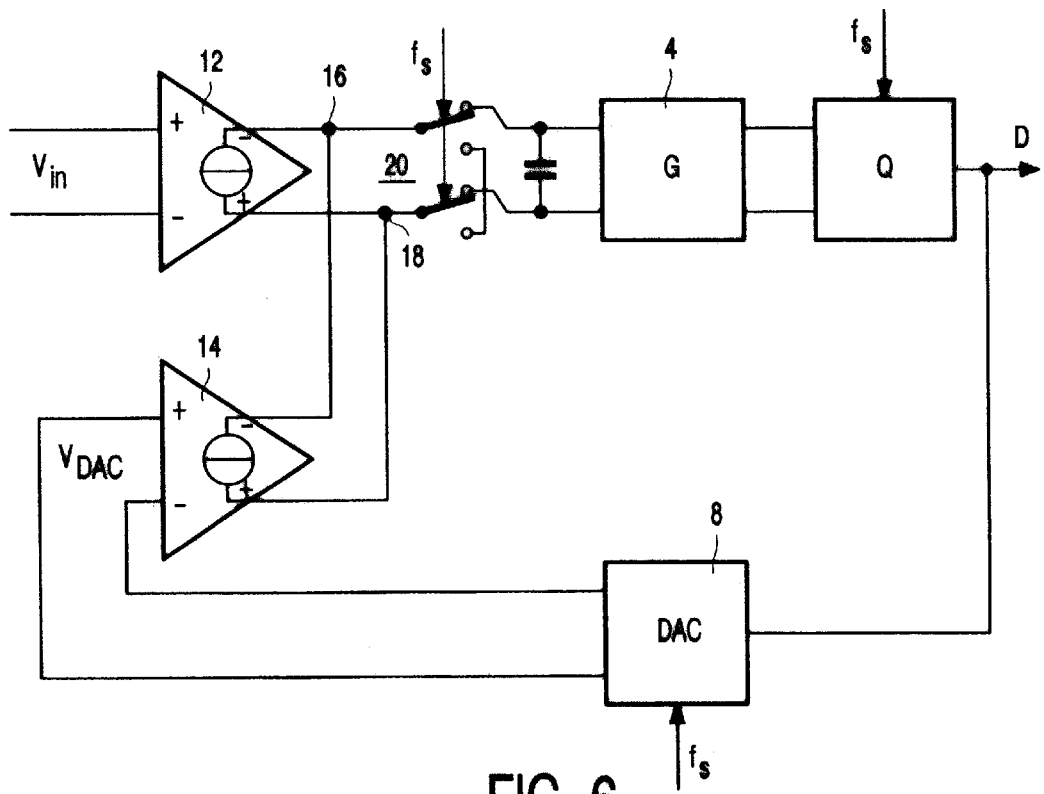
FIG. 6 is a circuit diagram of an embodiment of a sigma-delta analog-to-digital converter according to the invention, of the type shown in FIG. 2 with a return-to-zero switch before the loop filter.

FIG. 6 is a circuit diagram of an embodiment of a sigma-delta analog-to-digital converter according to the invention. The return-to-zero switch 20 has been moved from the output of the second voltage-to-current converter 14 to the input of the loop filter 4. This topology precludes the gain error in that the return-to-zero switch 20 is moved from the feedback branch to the error signal branch. Thus, the open-loop gain is reduced due to the return-to-zero action, but the closed-loop gain is hardly affected, as long as the remaining open-loop gain is sufficiently large, as is the case in practice. The new topology therefore restores the gain accuracy.

The performance of the sigma-delta analog-to-digital converter according to the invention may be compared to the switched-capacitor sigma-delta analog-to-digital converter of FIG. 1B, which may also show good gain accuracy if well designed. Its performance in respect of power dissipation is better. This is due to the higher power dissipation in the operational transconductance amplifiers in the loop filter of the switched-capacitor sigma-delta analog-to-digital converter, which must be able to settle to sufficient accuracy within a clock period.

Figure 7:
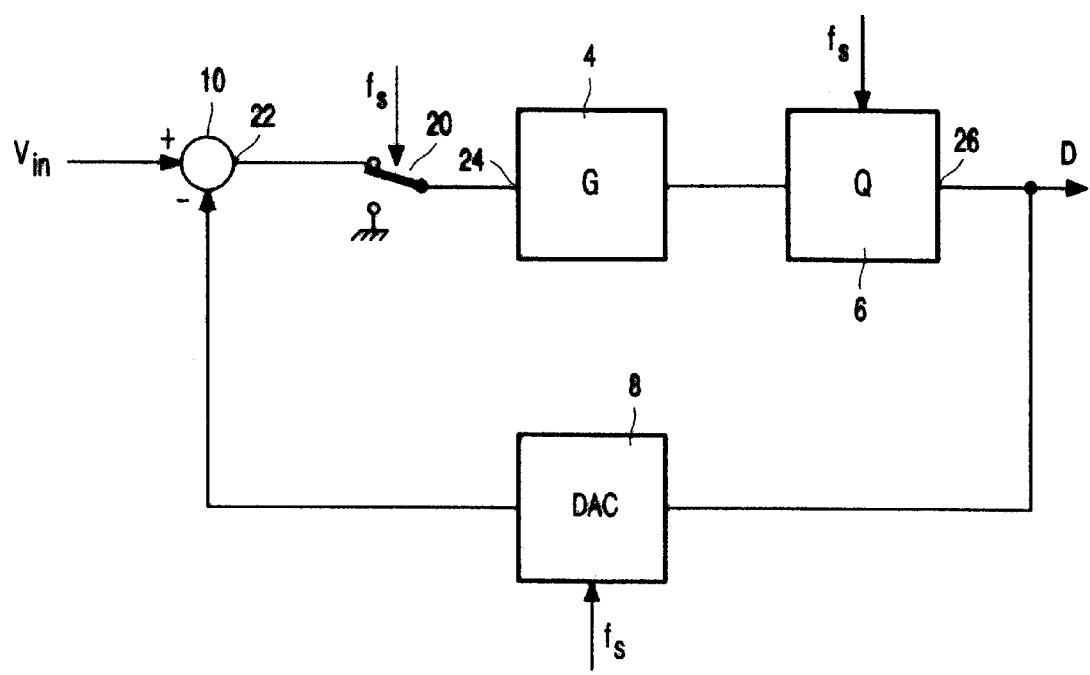
FIG. 7 is a circuit diagram of a general embodiment of a sigma-delta analog-to-digital converter according to the invention with a return-to-zero switch before the loop filter.

The embodiments of the present invention described herein are intended to be taken in an illustrative and not a limiting sense. Various modifications may be made to these embodiments by persons skilled in the art without departing from the scope of the present invention as defined in the appended claims. FIG. 7 shows a circuit diagram of a general embodiment of a sigma-delta analog-to-digital converter according to the invention with a return-to-zero switch 20 before the loop filter 4. The return-to-zero switch 20 is arranged between an output 22 of the subtractor 10 and an input 24 of the loop filter 4. The quantizer 6 has an output 26 for providing the data signal D. The quantizer 6 may be a 1-bit or a multi-bit quantizer, and similarly the digital-to-analog converter 8 may be a 1-bit or multi-bit digital-to-analog converter. The subtractor 10 may operate on single-ended or differential analog input and feedback signals, and the signals themselves may be voltages or currents.

What is claimed is:

1. A sigma-delta analog-to-digital converter for converting an analog input signal into a digital output signal, comprising in a signal processing loop:

means (10) for providing a difference signal in response to the analog input signal and an analog feedback signal, said means (10) comprising a first voltage-to-current converter (12) for converting the analog input signal to a first output current and a second voltage-to-current converter (14) for converting the analog feedback signal to a second output current;

means (4) for filtering the difference signal and for providing a filtered difference signal;

means (6) for sampling and quantizing the filtered difference signal and having an output (26) for providing the digital output signal;

a digital-to-analog converter (8) for converting the digital output signal to the analog feedback signal; and a return-to-zero switch (20) included in the signal processing loop, characterized in that the return-to-zero switch (20) is arranged between an output (22) of the means (10) for providing the difference signal and an input (24) of the means (4) for filtering the difference signal.

2. A sigma-delta analog-to-digital converter as claimed in claim 1, wherein the first (12) and second (14) voltage-to-current converters have differential inputs and outputs and wherein the digital-to-analog converter (8) has differential outputs for feeding the differential inputs of the second voltage-to-current converter (14).

* * * * *